(12) United States Patent
Arbogast et al.

(10) Patent No.: US 6,795,307 B2
(45) Date of Patent: Sep. 21, 2004

(54) TOOL-LESS LATCH MECHANISM FOR AN ENCLOSURE PANEL

(75) Inventors: Porter Rodgers Arbogast, Fort Collins, CO (US); Arlen L. Roesner, Fort Collins, CO (US); David W. Mayer, Fort Collins, CO (US); Tom J. Searby, Greeley, CO (US); Clint E. Conrady, Fort Collins, CO (US); Tillman Frazier Taylor, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/285,892

(22) Filed: Oct. 31, 2002

(65) Prior Publication Data

US 2004/0085720 A1 May 6, 2004

(51) Int. Cl.[7] ................................................. G06F 1/16
(52) U.S. Cl. ..................... 361/683; 361/679; 312/223.2; 292/175
(58) Field of Search ................................. 361/683, 679, 361/684–686, 724–727; 312/223.1–223.3, 285–289, 290, 294, 319.1, 319.8, 325.5, 229, 265.6, 293.3; 292/128, 228, 226, 229, 129, 35–36, 169, 170, 8, 30, DIG. 49, 114, 175, 251, 66; 248/560; 220/4.02

(56) References Cited

U.S. PATENT DOCUMENTS

| | | | |
|---|---|---|---|
| 5,323,298 A | | 6/1994 | Shatas et al. |
| 5,743,606 A | | 4/1998 | Scholder |
| 5,918,956 A | | 7/1999 | Scholder |
| 5,931,550 A | * | 8/1999 | Chen ........................... 312/244 |
| 6,053,586 A | | 4/2000 | Cook et al. |
| 6,109,669 A | * | 8/2000 | Pinkow ....................... 292/175 |
| 6,198,040 B1 | | 3/2001 | Desousa et al. |
| 6,246,572 B1 | | 6/2001 | Myers et al. |
| 6,266,237 B1 | * | 7/2001 | Jensen et al. ............... 361/683 |
| 6,266,239 B1 | * | 7/2001 | Cook et al. ................. 361/683 |
| 6,273,532 B1 | * | 8/2001 | Chen et al. .............. 312/223.2 |
| 6,296,334 B1 | * | 10/2001 | Liao ........................ 312/223.2 |
| 6,333,860 B1 | | 12/2001 | Oliphant et al. |
| 6,354,680 B1 | * | 3/2002 | Lin et al. .................. 312/223.2 |
| 6,359,836 B1 | | 3/2002 | Sevier et al. |
| 6,362,975 B1 | * | 3/2002 | Liu et al. .................... 361/796 |
| 6,367,896 B1 | * | 4/2002 | Peng et al. .............. 312/223.2 |
| 6,373,692 B1 | | 4/2002 | Cheng |
| 6,407,912 B1 | * | 6/2002 | Chen et al. ................. 361/683 |
| 6,542,356 B2 | * | 4/2003 | Gan ........................... 361/683 |
| 6,688,657 B2 | * | 2/2004 | Peacock et al. ............... 292/35 |

* cited by examiner

*Primary Examiner*—Michael Datskovskiy
(74) *Attorney, Agent, or Firm*—Kevin M. Hart (57) ABSTRACT

A tool-less latch mechanism for attaching a panel to an enclosure for electronic equipment such as a computer. A lever is mounted to a first enclosure component at a pivot point and is operable to move in a pivot plane. A pawl extends from the lever substantially orthogonal to the pivot plane, and an arcuate slot is fixed on a second enclosure component. When the lever pivots from an open to a closed position, engagement of the pawl with a first surface of the slot causes relative movement between the enclosure components in a first longitudinal direction. When the lever pivots from the closed to the open position, engagement of the pawl with a second surface of the slot causes relative movement between the enclosure components in an opposite longitudinal direction.

17 Claims, 11 Drawing Sheets

TOOL-LESS LATCH MECHANISM FOR AN ENCLOSURE PANEL

FIELD OF THE INVENTION

This invention relates to techniques for latching a panel to an enclosure for electronic equipment such as a computer.

BACKGROUND

Many enclosures for electronic equipment are designed to include a removable panel. Removable panels might include, for example, covers, lids, tops, bottoms, sides, fronts, backs and the like. In removable panel designs, it is desirable to provide a convenient mechanism for latching the panel to the enclosure and for unlatching the panel for removal. Generally the most convenient means for doing so are those that do not require tools.

One challenge in achieving an effective tool-less latch design for electronic equipment is that, when latching a panel to an enclosure, significant force is sometimes required to compress "EMI" gaskets between the panel and the enclosure. (The acronym EMI as used herein shall mean electromagnetic interference. Compressible EMI gaskets are commonly interposed between a panel and an enclosure to reduce the amount of electromagnetic energy that escapes from the enclosure.)

Another challenge in latch design for electronic equipment is to maintain compactness of the panel/enclosure assembly both in the vertical and the horizontal dimensions.

By way of example, U.S. Pat. No. 6,273,532 ("Chen") discloses a handle mounted to a chassis wall of an enclosure. The handle disclosed in Chen is disposed on the outside of the enclosure and pivots away from the back of the enclosure. It therefore interferes with product compactness in the horizontal dimension. And while the handle disclosed in Chen is able to provide an ejection force when removing the enclosure lid, the handle is not operable to provide a compression or insertion force when attaching the lid. By way of further example, U.S. Pat. No. 6,373,692 ("Cheng") discloses a handle that is recessed into the lid of an enclosure. The handle in Cheng pivots upward, which interferes with product compactness in the vertical dimension. In addition, the handle in Cheng provides neither an insertion force nor an ejection force.

SUMMARY OF THE INVENTION

A tool-less latching mechanism according to the invention facilitates product compactness in the vertical and horizontal dimensions. It also provides both an insertion force for installing a panel and an ejection force for removing a panel.

A lever having a pawl is mounted to an enclosure panel at a pivot point. An arcuate slot is provided on a surface of the enclosure. To install the panel on the enclosure, the lever is placed in an open position and the pawl is engaged with an inside surface of the slot. When the lever is pivoted from the open position to a closed position, the pawl exerts a force on the inside surface of the slot causing the panel to slide forcefully onto the enclosure. To remove the panel from the enclosure, the lever is pivoted from the closed position toward the open position. This movement causes the pawl to exert a force on an outside surface of the slot, which forces the panel to slide away from the enclosure. The movement of the lever is contained entirely within the plane of the panel or within a plane that is parallel with the plane of the panel. And the excursion path of the lever need not extend substantially beyond the area of the panel. In alternative embodiments, the lever may be mounted to an enclosure component, and the slot fixed to the panel. The location of the latch may also be varied. For example, the latch may be located near an end of the enclosure or at an intermediate location. Other variations may also be made, as will become apparent in the following detailed description.

DETAILED DESCRIPTION OF THE PREFERRED EMBODIMENTS

Figure 1:
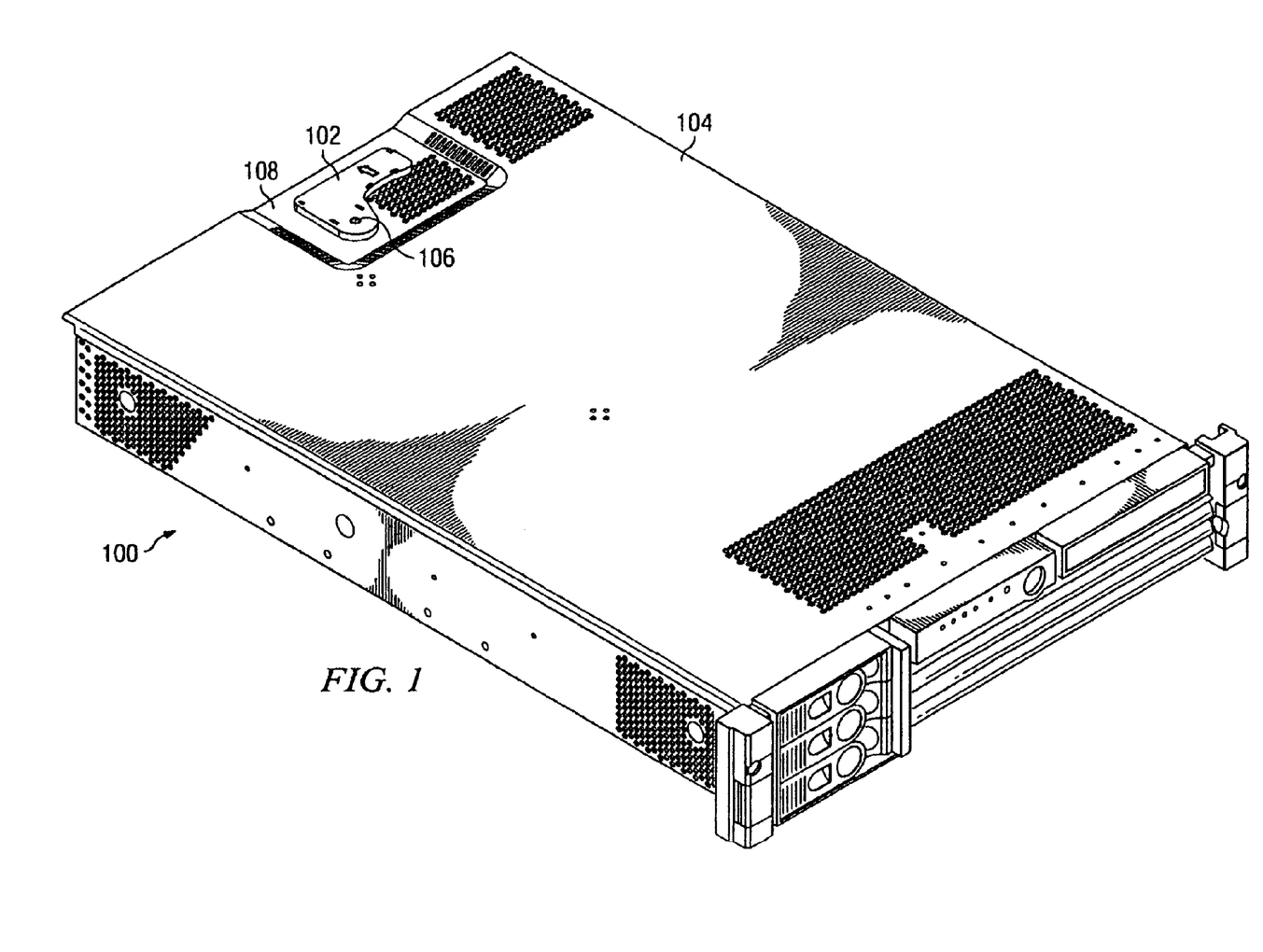
FIG. 1 is an oblique top view of a computer enclosure incorporating a tool-less latch mechanism according to a preferred embodiment of the invention, wherein the latch mechanism is shown in a closed position.

FIG. 1 illustrates a computer enclosure 100 incorporating a latch mechanism according to a preferred embodiment of the invention. A lever 102 is mounted to a panel 104 of enclosure 100 at a pivot point 106. The lever 102 is operable to move in a pivot plane between a closed position (shown in FIG. 1) and an open position (shown in FIG. 2). The pivot plane may be parallel with or coplanar with the plane of panel 104. In the embodiment shown, lever 102 is mounted to panel 104 in a recessed area 108, and the lever has a sufficiently low profile that the lever does not break the plane of panel 104. In other embodiments, the lever may be mounted above the plane of the panel.

Figure 2:
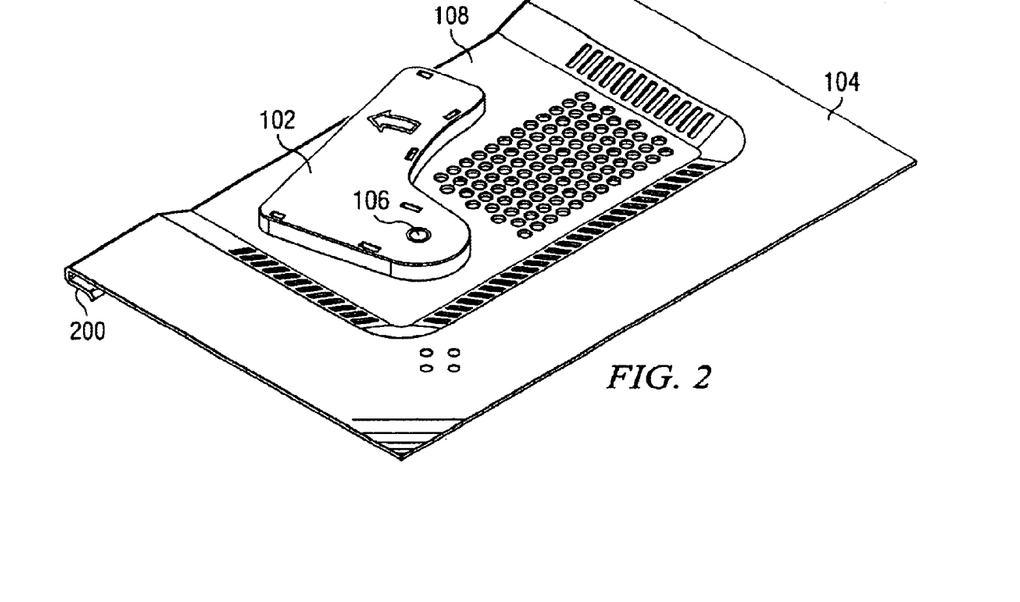
FIG. 2 is an oblique top view of the latch mechanism of FIG. 1 wherein the latch mechanism is shown in an open position.
Figure 3:
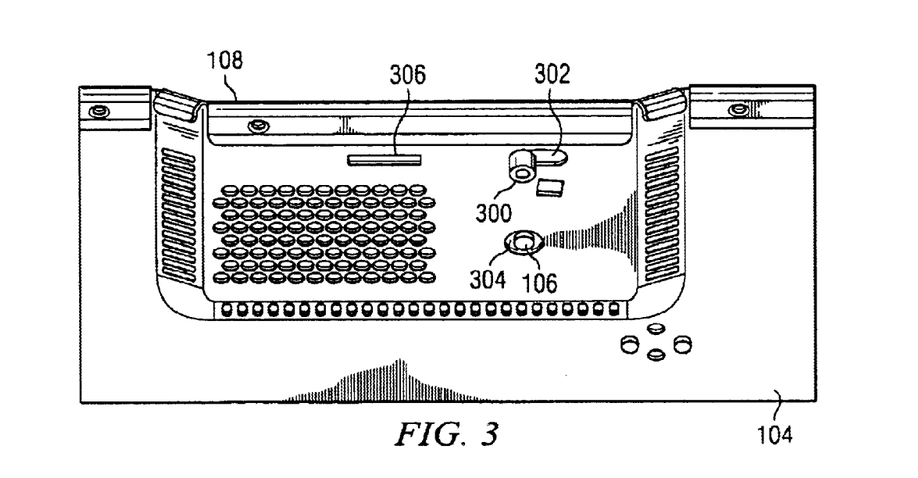
FIG. 3 is an oblique bottom view of the panel of FIG. 1 wherein the latch mechanism is shown in the closed position.
Figure 4:
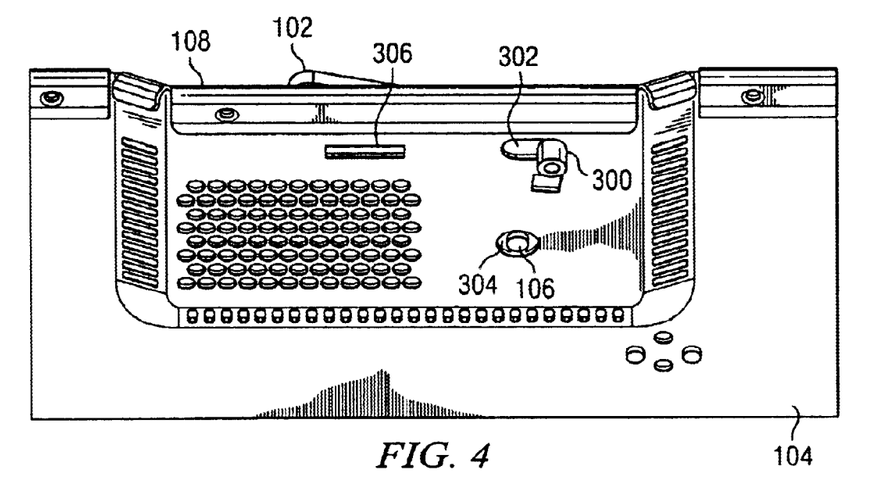
FIG. 4 is an oblique bottom view of the panel of FIG. 1 wherein the latch mechanism is shown in the open position.

FIGS. 3 and 4 provide a bottom view of the same positions depicted in FIGS. 1 and 2, respectively. A pawl 300 is fixed to lever 102 and extends from the lever in a direction substantially orthogonal to the pivot plane of the lever. A hole 302 is provided in panel 104 to allow the pawl to protrude through to the underside of the panel. Lever 102 may be attached to panel 104 by any conventional means to form the pivot joint 106. In the embodiment shown, this is done with a swage 304. FIG. 3 depicts the closed position of lever 102. FIG. 4 depicts the open position.

FIGS. 11–13 and 17–18 illustrate an arcuate slot 1100 fixed to a chassis or enclosure wall 1102 of enclosure 100. In the embodiment shown, wall 1102 is orthogonal to panel 104, and slot 1100 is defined in a flange 1104 disposed at the top of wall 1102. Flange 1104 may include a recessed area 1106 to accommodate recessed area 108 of panel 104. Slot 1100 includes an inside surface 1108 and an outside surface 1110. Preferably, inside surface 1108 is arcuate according to a first radius 1300, and outside surface 1110 is arcuate according to a second radius 1302. The arcs defined by the two surfaces need not be exactly concentric, but the slot defined between the two surfaces should be wide enough to clear pawl 300 as it travels through the slot. One way to accomplish this is to ensure that radius 1302 is longer than radius 1300 by at least the diameter of pawl 300.

Figure 5:
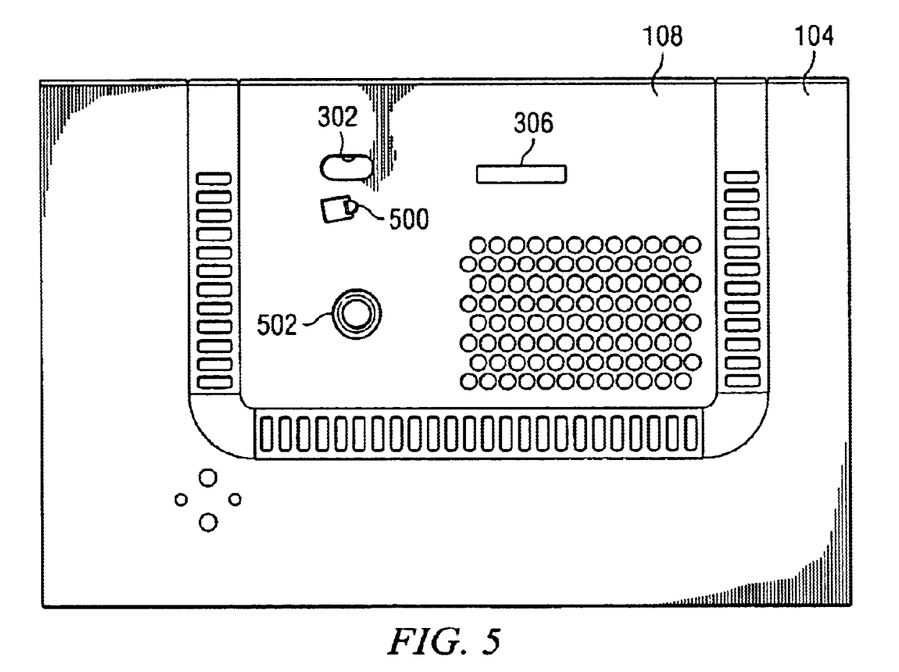
FIG. 5 is a close-up orthogonal top view of the panel of FIG. 1 shown without the latch mechanism.
Figure 6:
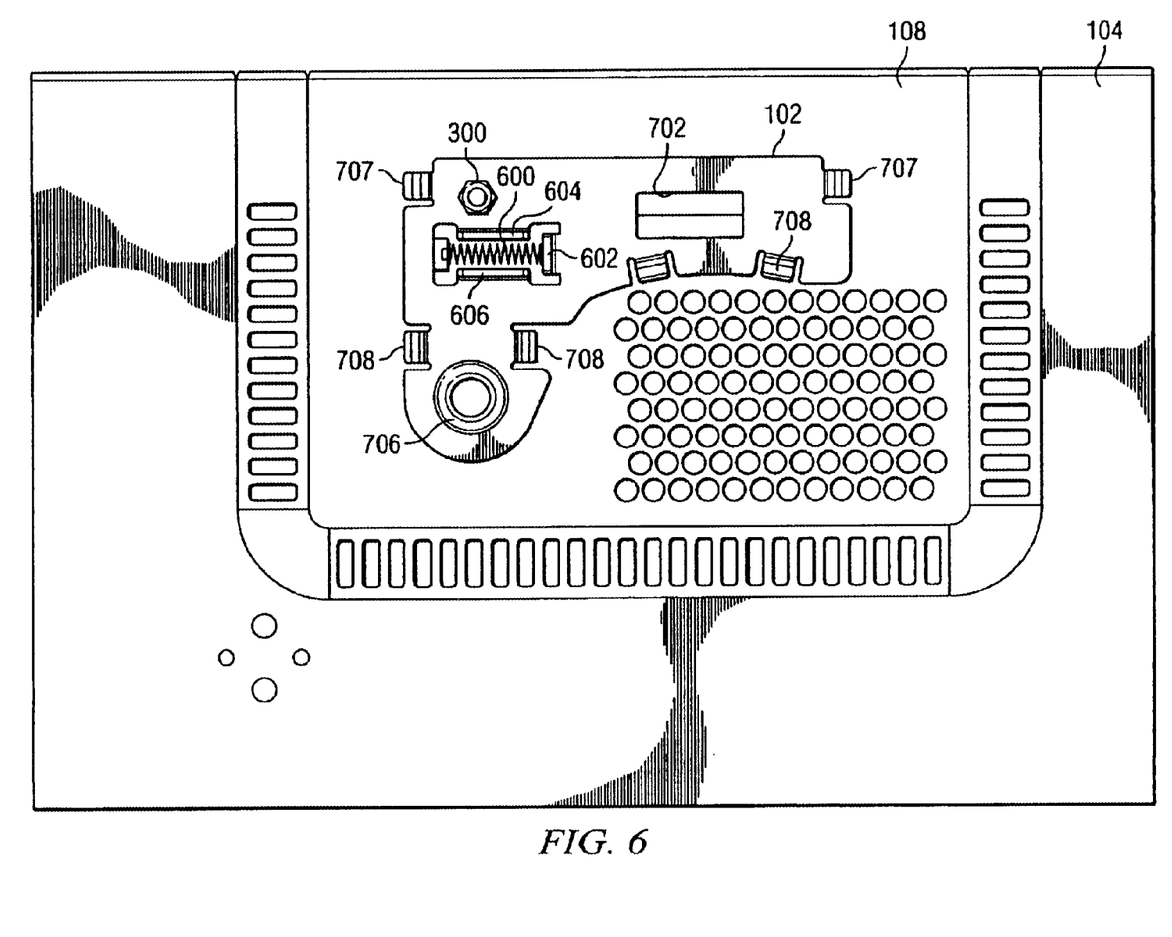
FIG. 6 is a close-up orthogonal top view of the panel of FIG. 1 shown with the latch lever and spring installed, but without the latch lever cover.
Figure 7:
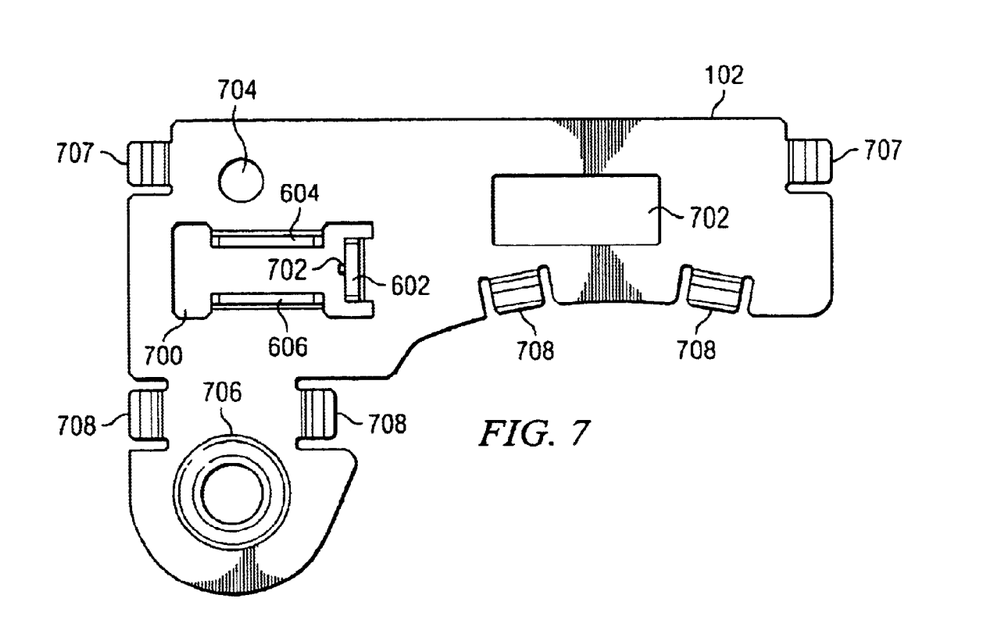
FIG. 7 is an orthogonal top view of the latch lever of FIG. 6.
Figure 8:
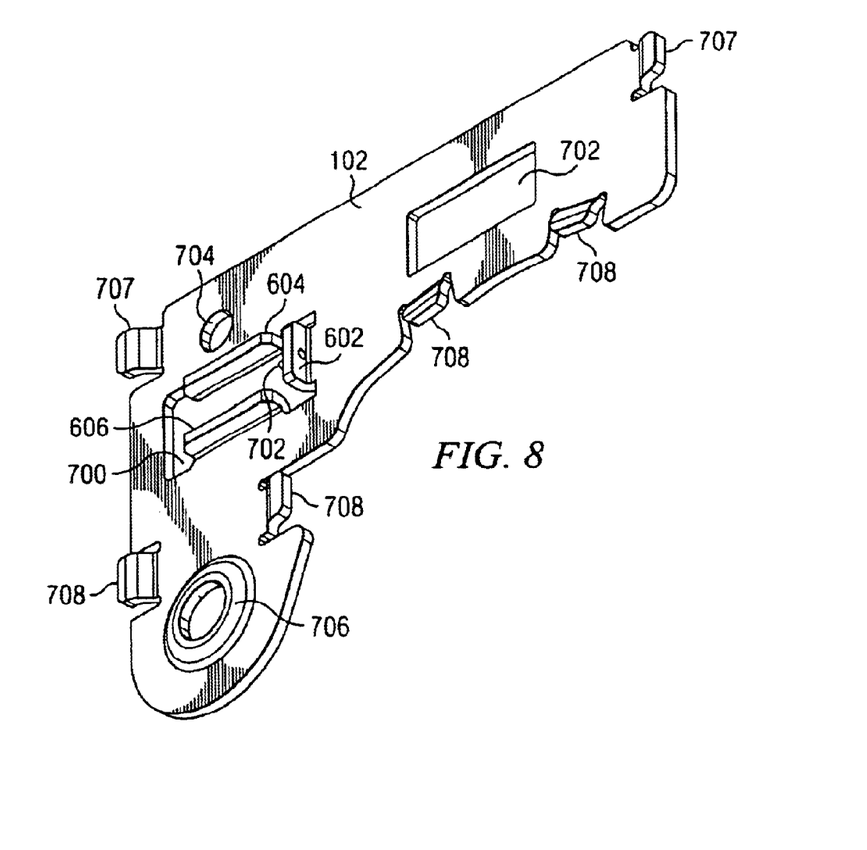
FIG. 8 is an oblique top view of the latch lever of FIG. 6.
Figure 9:
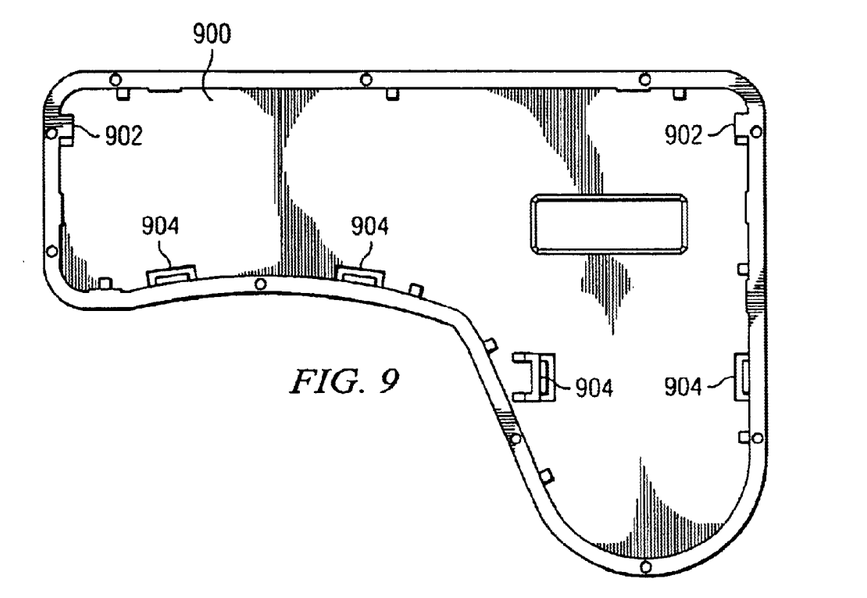
FIG. 9 is an orthogonal bottom view of the latch lever cover of FIG. 1.
Figure 10:
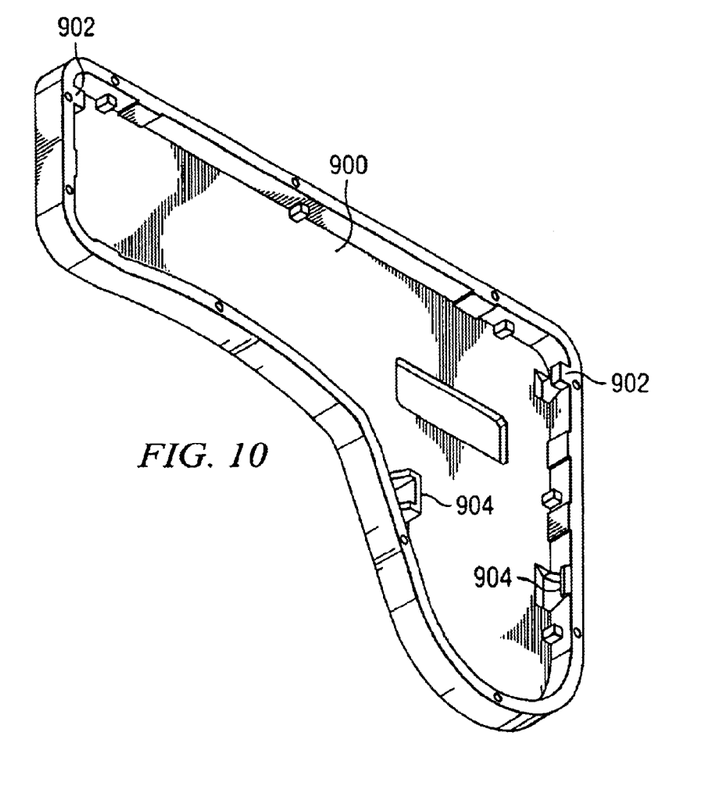
FIG. 10 is an oblique bottom view of the latch lever cover of FIG. 1.

FIG. 5 provides a top view of panel 104 without lever 102 installed thereon. FIG. 6 provides the same view with lever 102 installed. In the illustrated embodiment, lever 102 is biased toward the closed position with a longitudinally compressed spring 600. In other embodiments, the lever need not be biased; or if it is biased, means other than a longitudinally compressed spring may be used to accomplish the bias. Spring 600 may be housed in a space 700 formed in lever 102. Spring 600 may be retained on one end by a protrusion 500 formed on panel 104, and on the other end by a protrusion 602 formed on lever 102. Protrusion 602 may include a rod or tab 700 to enhance retention of spring 600. Longitudinal protrusions 604 and 606 retain spring 600 on either side. Spring 600 is retained on bottom by the surface of panel 104 (specifically, recessed area 108). Spring 600 is retained on top by a cover 900 attached to lever 102.

In operation (referring now to FIG. 17), panel 104 may be placed on top of enclosure 100 so that pawl 300 is disposed in position 1700 adjacent an opening 1702 of slot 1100. Because lever 102 is biased toward the closed position, it will be in the closed position when pawl 300 is at position 1700. Panel 104 is then slid forward so that pawl 300 reaches position 1704, at which point it engages a slanted surface 1706 of opening 1702. As panel 104 slides further forward, lever 102 moves from its closed position to its open position by virtue of the lateral movement of pawl 300 as it travels across slanted surface 1706 in direction 1708. (Surface 1706 is slanted relative to longitudinal direction 1724). As panel 104 slides further forward, pawl reaches position 1710, where it engages inside surface 1108. When pawl 300 is in position 1710, lever 102 is in its open position 1712, and pivot point 106 is in position 1714. Lever 102 may then be pivoted by hand from its open position 1712 to its closed position 1716 by turning it in direction 1718. When this is done, pawl 300 travels across inside surface 1108 according to arc 1720, causing pivot point 106 to move from position 1714 to position 1722 in longitudinal direction 1724 (radially outward relative to the arc defined by slot 1100). Panel 104 may be engaged with the sides of enclosure 100 in order to prevent lateral movement of panel 104 as it slides forward.

Figure 14:
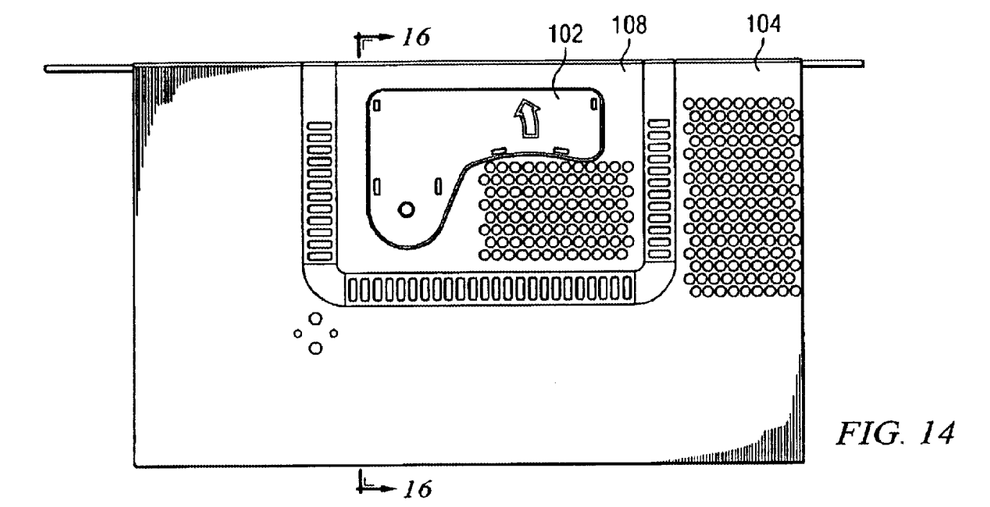
FIG. 14 is an orthogonal top view of the latch mechanism of FIG. 1 illustrating the section taken for FIGS. 15 and 16.
Figure 15:
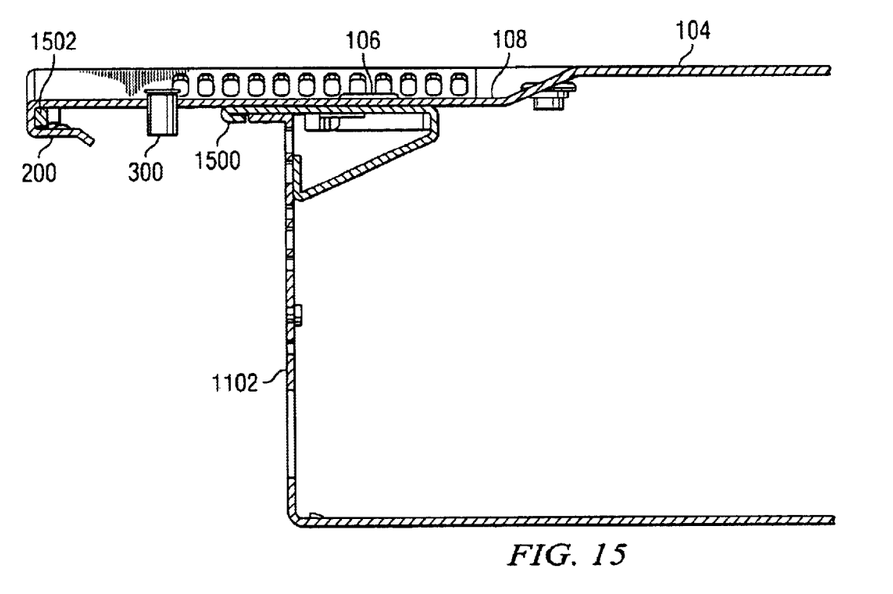
FIGS. 15 and 16 are cross-sectional assembly views of the computer enclosure and panel of FIG. 1, taken along the section indicated in FIG. 14.
Figure 16:
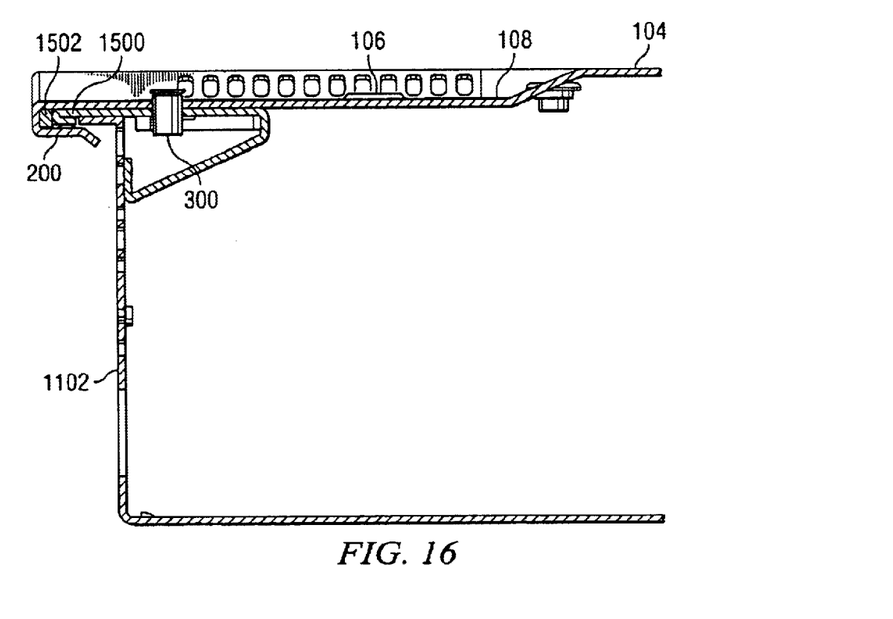
Figure 17:
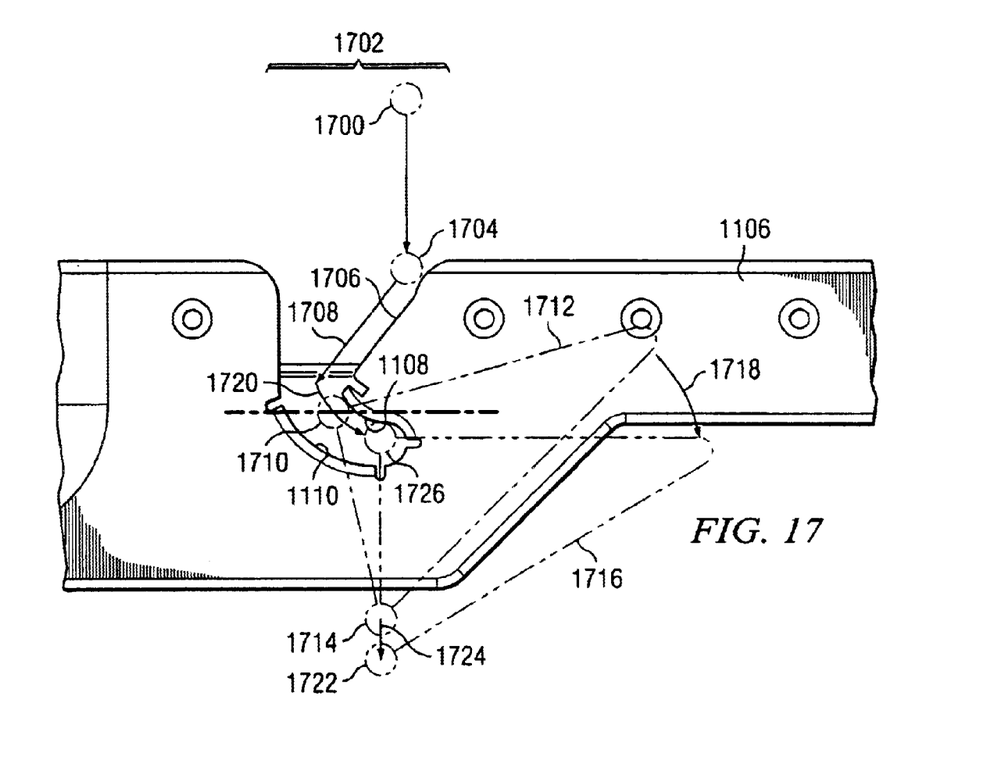
FIG. 17 is a cutaway top view of the flange of FIGS. 11 and 12 illustrating the movement of the latch lever pawl during installation of the panel onto the enclosure.

FIGS. 15 and 16 provide a cross sectional view of the just-described process of engaging panel 104 with enclosure 100. (The section taken in FIGS. 15 and 16 is indicated at A—A in FIG. 14.) A channel 200 may be provided on panel 104. And a corresponding flange 1500 may be provided on wall 1102. An EMI gasket 1502 may be placed inside channel 200. When panel 104 slides onto the enclosure, flange 1500 mates with channel 200, compressing EMI gasket 1502.

Figure 11:
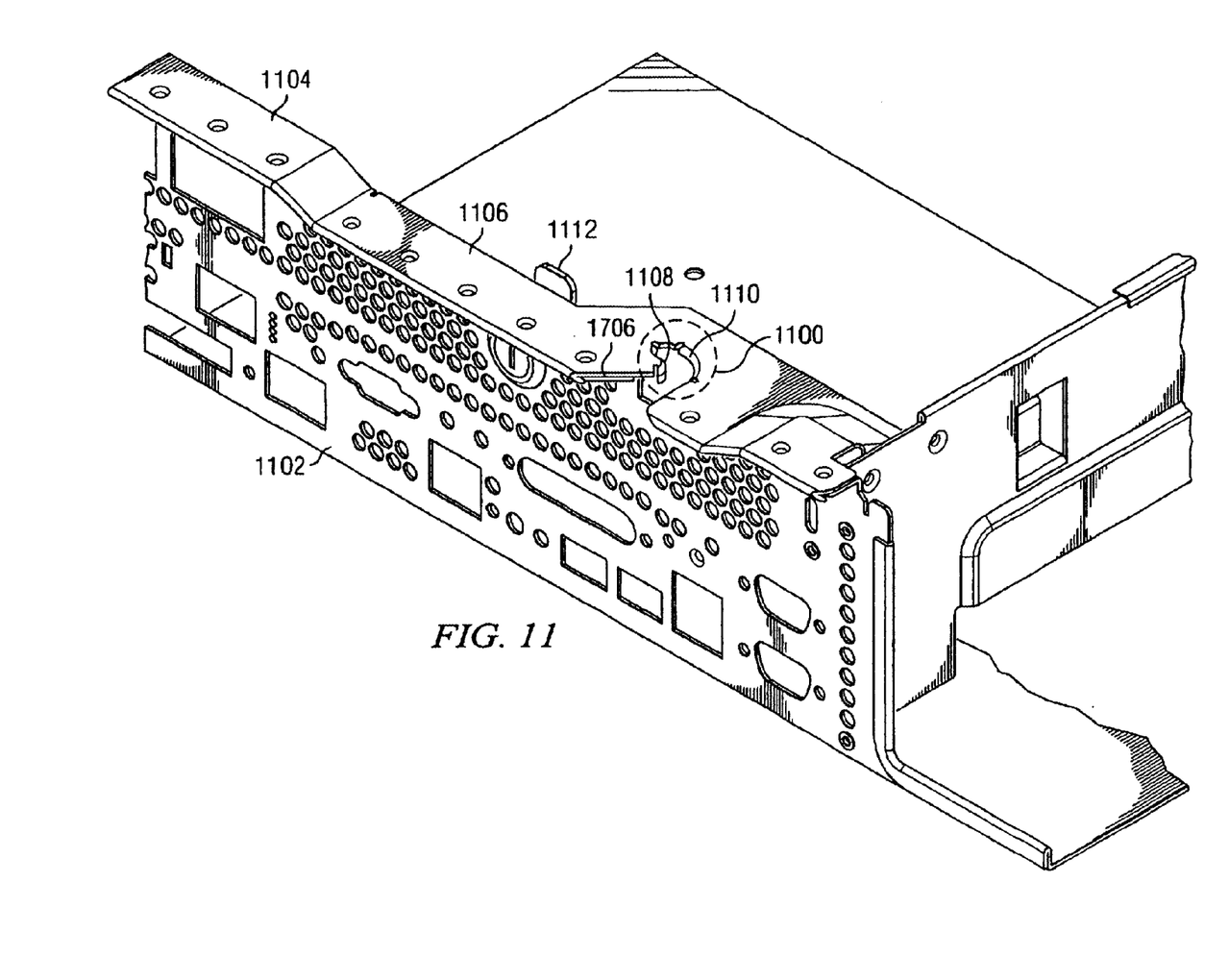
FIG. 11 is an oblique back view of a flange on a wall of the computer enclosure of FIG. 1.
Figure 12:
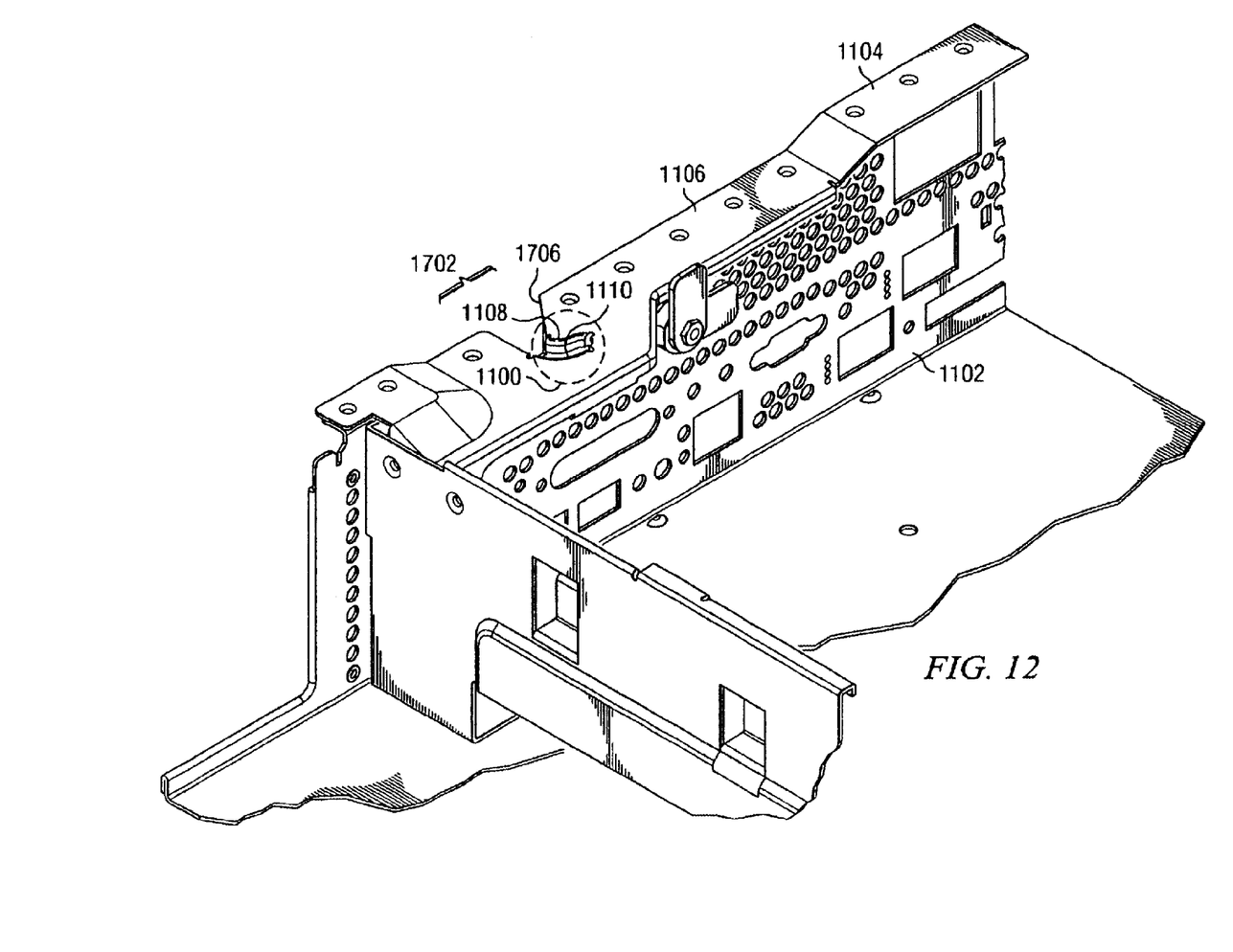
FIG. 12 is an oblique front view of the flange and wall of FIG. 11.
Figure 13:
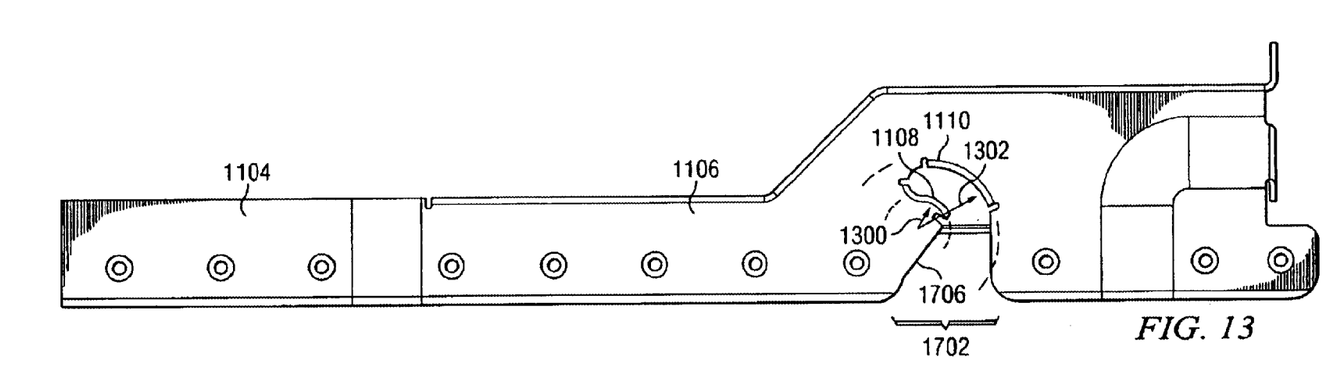
FIG. 13 is an orthogonal top view of the flange of FIGS. 11 and 12.

Once pawl 300 reaches position 1726, panel 104 is fully seated over enclosure 100. At that point, an optional lock pawl 1112 mounted to wall 1102 may be raised as shown in FIGS. 11 and 12. When lock pawl 1112 is raised, it passes through a clearance hole 306 formed in panel 104 and enters an opening 702 formed in lever 102. When lock pawl 1112 has crossed the pivot plane of lever 102 and is disposed in opening 702, panel 104 is prevented from moving backward away from its engaged position.

Figure 18:
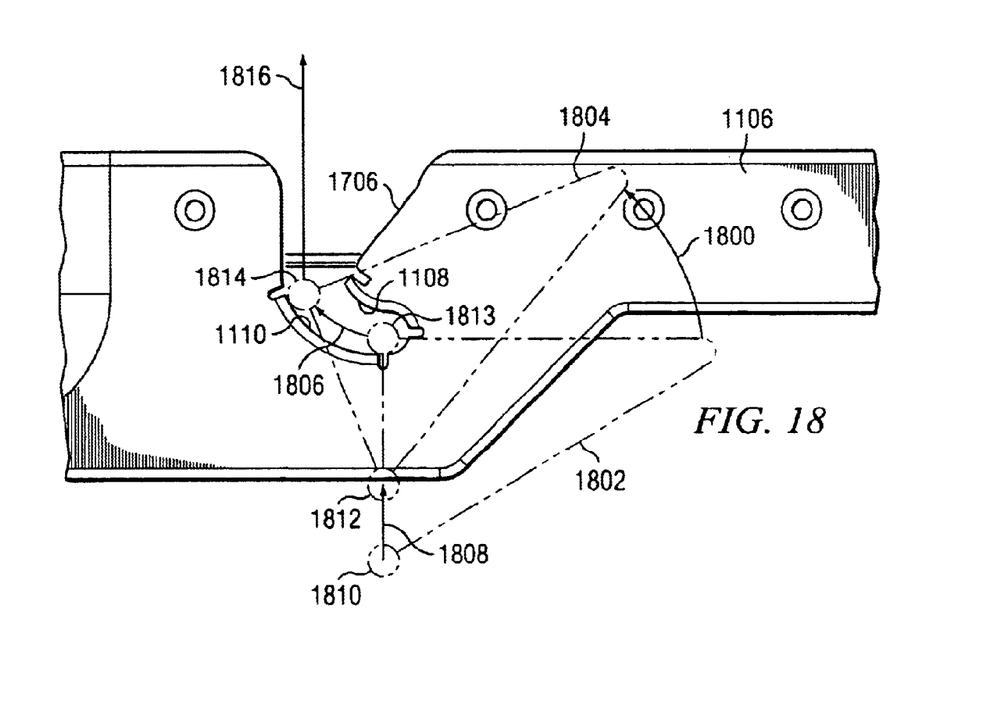
FIG. 18 is a cutaway top view of the flange of FIGS. 11 and 12 illustrating the movement of the latch lever pawl during removal of the panel from the enclosure.

Removal of panel 104 will now be described with reference to FIG. 18. After lowering optional lock pawl 1112, lever 102 is turned in direction 1800 so that it pivots from its closed position 1802 to its open position 1804. As lever 102 moves from its closed to its open position, pawl 300 engages outside surface 1110 of slot 1100 and travels along arc 1806 from position 1813 to position 1814. This, in turn, causes pivot point 106 to move in longitudinal direction 1808 from position 1810 to position 1812. (Longitudinal direction 1808 is opposite direction 1724.) Once pawl 300 reaches position 1814, panel 104 may be slid away from the enclosure in direction 1816.

Further details of lever 102 and cover 900 will now be discussed with reference to FIGS. 6–10. Pawl 300 may be fixed to lever 102 by any conventional means. In addition, pawl 300 may be integrally formed with lever 102. In the embodiment shown, a hole 704 is provided in lever 102 for receiving pawl 300 and forming a press-in fit. As was mentioned above, pivot joint 106 may be accomplished by any conventional means. But in the illustrated embodiment, a hole 706 is provided in lever 102 (and another hole 502 is provided in panel 102—see FIG. 5) to accommodate swage 304. One way of attaching optional cover 900 to lever 102 is by providing raised tabs 707, 708 on lever 102 and corresponding catches 902, 904 on cover 900. Tabs 707 may be placed underneath catches 902, and tabs 708 may be snapped under catches 904.

In alternative embodiments, the positions of lever 102 and slot 1100 may be changed: For example, lever 102 may be attached to an enclosure wall or chassis wall 1102, while slot 1100 may be disposed on panel 104. And slot 1100 need not be disposed on a flange, but may instead be defined by any other suitable component of the enclosure 100, the wall 1102, or the panel 104, depending on the embodiment. In addition, slot 1100 may be disposed at either end of enclosure 100, or even fixed at a location somewhere in between the ends of enclosure 100 if it is desired to located lever 102 at such an intermediate location.

Other modifications may also be made to the illustrated embodiments without deviating from the scope of the invention as defined by the following claims and their equivalents.

What is claimed is:

1. A latch, comprising:
   a lever mounted to a first enclosure component at a pivot point and operable to move in a pivot plane;
   a pawl extending from the lever substantially orthogonal to the pivot plane; and
   an arcuate slot fixed on a second enclosure component; wherein:

when the lever pivots from an open to a closed position, engagement of the pawl with a first surface of the slot causes relative movement between the first and second enclosure components in a first longitudinal direction; and when the lever pivots from the closed to the open position, engagement of the pawl with a second surface of the slot causes relative movement between the first and second enclosure components in a second longitudinal direction opposite the first.

2. The latch of claim 1, wherein:

the first enclosure component comprises a panel; and the second enclosure component comprises an enclosure wall or chassis wall orthogonal to the panel.

3. The latch of claim 1, wherein:

the second enclosure component comprises a panel; and the first enclosure component comprises an enclosure wall or chassis wall orthogonal to the panel.

4. The latch of claim 2, wherein:

the panel defines a panel plane; and the pivot plane is coplanar or parallel with the panel plane.

5. The latch of claim 4, wherein:

the lever is mounted to the panel in a recessed area of the panel such that the top of the lever does not break the panel plane.

6. The latch of claim 1, wherein:

one of the first and second enclosure components comprises a flange, and the other comprises a channel for receiving the flange; and relative movement between the first and second enclosure components in the first longitudinal direction causes the flange to mate with the channel.

7. The latch of claim 6:

further comprising an EMI gasket disposed inside the channel.

8. The latch of claim 1:

further comprising a lock pawl mounted to the second enclosure component; and wherein the lever comprises an opening for receiving the lock pawl.

9. The latch of claim 1, wherein:

the first direction is radially outward relative to the arc of the slot.

10. The latch of claim 1, wherein:

the first surface is arcuate according to a first radius;

the second surface is arcuate according to a second radius; and the second radius is longer than the first radius by at least the diameter of the pawl.

11. The latch of claim 1, wherein:

the slot comprises an opening at one end for receiving the pawl; and the opening comprises a slanted surface that is slanted relative to the first direction.

12. The latch of claim 11, wherein:

the latch is biased toward the closed position; and engagement between the pawl and the slanted surface causes the lever to pivot from the closed position to the open position as the pawl enters the slot.

13. The latch of claim 1, wherein:

the latch is biased toward the closed position by a longitudinally compressed spring;

the spring is retained on one end by a protrusion fixed to the first enclosure component;

the spring is retained on its other end by an end protrusion fixed to the lever;

the spring is retained on either side by parallel longitudinal protrusions fixed to the lever;

the spring is retained on bottom by a surface of the first enclosure component; and the spring is retained on top by a cover attached to the lever.

14. The latch of claim 1, wherein:

the second enclosure component is a flange.

15. The latch of claim 14, wherein:

the flange is disposed on an enclosure wall or chassis wall.

16. The latch of claim 14, wherein:

the flange is disposed at an end of the enclosure.

17. The latch of claim 14, wherein:

the flange is not located at an end of the enclosure.

* * * * *